(12) United States Patent
Yang et al.

(10) Patent No.: US 11,863,082 B2
(45) Date of Patent: Jan. 2, 2024

(54) POWER CONVERTER AND CONTROL METHOD THEREFOR

(71) Applicant: ABB SCHWEIZ AG, Baden (CH)

(72) Inventors: Xiaobo Yang, Beijing (CN); Kai Liu, Beijing (CN); Chunming Yuan, Beijing (CN); Hailian Xie, Beijing (CN); Xing Huang, Beijing (CN)

(73) Assignee: ABB Schweiz AG, Baden (CH)

( * ) Notice: Subject to any disclaimer, the term of this patent is extended or adjusted under 35 U.S.C. 154(b) by 347 days.

(21) Appl. No.: 17/427,807

(22) PCT Filed: May 6, 2019

(86) PCT No.: PCT/CN2019/085732
§ 371 (c)(1),
(2) Date: Aug. 2, 2021

(87) PCT Pub. No.: WO2020/223883
PCT Pub. Date: Nov. 12, 2020

(65) Prior Publication Data
US 2022/0123662 A1   Apr. 21, 2022

(51) Int. Cl.
*H02M 5/40* (2006.01)
*H02M 5/458* (2006.01)
(Continued)

(52) U.S. Cl.
CPC .......... *H02M 5/4585* (2013.01); *G01R 31/08* (2013.01); *H02H 3/44* (2013.01); *H02M 1/325* (2021.05); *H02M 1/084* (2013.01)

(58) Field of Classification Search
CPC ........ H02M 5/40; H02M 5/4505; H02M 1/32; H02M 1/325; H02M 5/45; H02H 3/08;
(Continued)

(56) References Cited

U.S. PATENT DOCUMENTS

| 9,819,188 B1 | 11/2017 | Pan et al. |
| 2006/0012374 A1* | 1/2006 | Kojovic ............... G01R 31/085 324/522 |

(Continued)

FOREIGN PATENT DOCUMENTS

| CN | 104166073 A | 11/2014 |
| CN | 104426343 A | 3/2015 |

(Continued)

OTHER PUBLICATIONS

China Office Action, issued by the National Intellectual Property Administration, regarding corresponding patent application Serial No. CN 2019800908224; dated May 26, 2022; 9 pages (with English translation).

(Continued)

*Primary Examiner* — Alex Torres-Rivera
(74) *Attorney, Agent, or Firm* — Greenberg Traurig, LLP

(57) ABSTRACT

A power converter includes a power conversion circuit having a first terminal set and a second terminal set, configured to convert power input via one of the first terminal set and the second terminal set and output the converted power via the other of the first terminal set and the second terminal set; a measurement unit; a controller configured to control the power conversion circuit to generate a voltage/current waveform travelling along the first network with a power supplied by a second power source linked to the second terminal set of the power conversion circuit in response to a condition that a change rate of the measurement of the voltage/current exceeds a threshold; and locate a fault on the first network. The power conversion circuit can be re-used for different modes of operation either for power transmission under normal condition or for fault location under fault condition.

18 Claims, 4 Drawing Sheets

(51) Int. Cl.
*H02M 1/32* (2007.01)
*G01R 31/08* (2020.01)
*H02H 3/44* (2006.01)
*H02M 1/084* (2006.01)

(58) Field of Classification Search
CPC .......... H02H 3/081; H02H 3/083; H02H 3/20; H02J 13/0004; H02J 13/00036; G01R 31/08; G01R 31/085; G01R 31/086; G01R 31/11

See application file for complete search history.

(56) References Cited

U.S. PATENT DOCUMENTS

| | | | |
|---|---|---|---|
| 2013/0021039 A1* | 1/2013 | Bjorklund | G01R 31/088 324/535 |
| 2015/0062768 A1 | 3/2015 | Prescott | |
| 2015/0333637 A1 | 11/2015 | Izumi | |
| 2016/0077149 A1 | 3/2016 | Schweitzer, III et al. | |
| 2017/0110875 A1* | 4/2017 | Schweitzer, III | H02H 3/50 |
| 2017/0131343 A1 | 5/2017 | Schweitzer, III et al. | |
| 2017/0234921 A1 | 8/2017 | Handy | |
| 2018/0294644 A1* | 10/2018 | Ha | H02H 1/0007 |
| 2019/0094290 A1* | 3/2019 | Schweitzer, III | G01R 31/11 |

FOREIGN PATENT DOCUMENTS

| | | |
|---|---|---|
| CN | 105259476 A | 1/2016 |
| CN | 105896537 A | 8/2016 |
| CN | 106605152 A | 4/2017 |
| CN | 106796257 A | 5/2017 |
| CN | 107209220 A | 9/2017 |
| WO | 2017-178480 A1 | 10/2017 |

OTHER PUBLICATIONS

International Search Report issued for International Patent Application No. PCT/CN2019/085732 dated Jan. 31, 2020.

Bloemink et al., "Increasing Distributed Generation Penetration using Soft Normally-Open Points," IEEE Pes General Meeting, Providence, RI, USA, 2010 (8 pages).

Stringfield et al., "Fault Location Methods for Overhead," in Transactions of the American Institute of Electrical Engineers. Part III: Power Apparatus and Systems, vol. 76, No. 3, pp. 518-529, (1957).

Tian et al., "A Fast Current Protection Scheme for Distribution Network with Distributed Generation," 10th IET International Conference on Developments in Power System Protection, DPSP 2010 (4 pages).

* cited by examiner

POWER CONVERTER AND CONTROL METHOD THEREFOR

CROSS REFERENCE TO RELATED APPLICATIONS

This application is a U.S. National Phase of International Application No. PCT/CN2019/085732, filed May 6, 2019, the disclosure of which is incorporated herein by reference in its entirety.

TECHNICAL FIELD

This invention relates generally to power conversion, and more particularly to conversion of power flowing between two power sources.

BACKGROUND ART

Soft Open point (SOP) is a kind of AC/AC power converter system installed at normally open switches (NOS) between terminals of two feeders in the power distribution network. Usually the SOP converter is a back-to-back converter system with two voltage source converters (VSCs). Examples are given in JEFFREY M. BLOEMINK AND TIMOTHY C. GREEN, INCREASING DISTRIBUTED GENERATION PENETRATION USING SOFT NORMALLY-OPEN POINTS, IEEE PES GENERAL MEETING, PROVIDENCE, RI, USA, 2010. The benefits from the installation of SOP includes optimal power flow control, reactive power condensation, fault isolation, and etc. However, because of the introduction of SOP equipment, the corresponding feeders change from radial type to dual power supply type, i.e. one power from substation (AC source) and another power from SOP, which brings protection issues.

Usually feeders in a distribution network are radial type. The so-called multi-steps-current-protection (MSCP) method, such three or four steps current protection method, has been widely employed for fault protection at radial type distribution network, which is disclosed in JIA TIAN, HOULEI GAO, MEIYI HOU, JUN LIANG, YISHU ZHAO, A FAST CURRENT PROTECTION SCHEME FOR DISTRIBUTION NETWORK WITH DISTRIBUTED GENERATION. 10TH IET INTERNATIONAL CONFERENCE ON DEVELOPMENTS IN POWER SYSTEM PROTECTION (DPSP 2010). However, once the SOP equipment is connected, the related feeders become dual power feeders. In order to protect the system under phase to phase fault, direction relay is usually installed at each protection. Besides, each section line needs two circuit breakers at each terminal of the line to isolate the fault line. This increases the system control complexity cost. Further, for the distribution network containing soft open point (SOP) equipment, the short circuit current contributed from SOP is usually of constant value and with rather low value (close to the nominal DC current). Therefore, it is quite difficult to employ TSOCP to protect the line with fault current from SOP side due the short circuit current is almost the same at each line. Finally, all the SOP may be tripped to avoid over current of the converter.

BRIEF SUMMARY OF THE INVENTION

According an aspect of present invention, it provides a power converter including: a power conversion circuit having a first terminal set and a second terminal set, being configured to convert power input via one of the first terminal set and the second terminal set and output the converted power via the other of the first terminal set and the second terminal set; a measurement unit, being configured to measure voltage/current at a point on a first network linking a first power source and the first terminal set of the power conversion circuit, wherein the point is arranged between a circuit breaker inserted in the first network and the first terminal set of the power conversion circuit; a controller, being configured to control the power conversion circuit to: generate a voltage/current waveform travelling along the first network with a power supplied by a second power source linked to the second terminal set of the power conversion circuit in response to a condition that a change rate of the measurement of the voltage/current exceeds a threshold; identify the voltage/current waveform from the measurements of the measurement unit; and locate a fault on the first network in consideration of an interval between a first timing when the controller identifies the voltage/current waveform and a second timing when the controller identifies an echo of the voltage/current waveform.

According to another aspect of present invention, it provides a method for controlling a power converter, including: measuring voltage/current at a point on a first network linking a first power source and a first terminal set of the power converter; controlling the power converter to generate a voltage/current waveform travelling along the first network with a power supplied by a second power source linked to a second terminal set of the power converter in response to a condition that a change rate of the measurement of the voltage/current exceeds a threshold; reading the measurements of voltage/current at the point after the condition becomes true and identifying the voltage/current waveform from the measurements; and locating a fault on the first network in consideration of an interval between a first timing when the controller identifies the voltage/current waveform and a second timing when the controller identifies an echo of the voltage/current waveform.

By using the solution according to present invention, the power conversion circuit can be re-used for different modes of operation either for power transmission under normal condition or for fault location under fault condition. This is helpful for realizing single-end travelling wave phase to phase fault location via control of the converter at SOP. With the proposed protection solution, additional breakers are not required when a conventional radial type distributed network system is upgraded to the dual power supply system with SOP. The solution is helpful for decreasing the implementation difficulty of the SOP solution.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Figure 1:
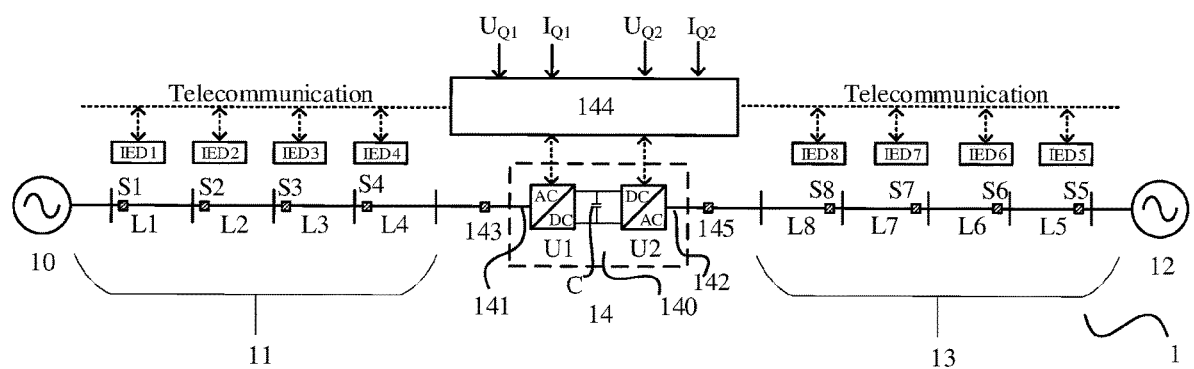
FIG. 1 shows a power distribution network according to an embodiment of present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

As shown in FIG. 1, a power distribution network 1 includes a first power source 10, a first network 11, a second power source 12, a second network 13, and a power converter 14. For example, as shown in FIG. 1, both of the first power source 10 and the second power source 12 are of AC power source, and the first network 11 and the second network 13 are of AC network distributing the AC power respectively to/from the first power source 10 and the second power source 12. Telecommunication (e.g. GOOSE) between a controller 144 of the power converter 14 and each relay (IED) is arranged.

The power converter 14 has a power conversion circuit 140, and the power conversion 140 has a first terminal set 141 and a second terminal set 142. The power conversion circuit 140 is configured to convert power input via one of the first terminal set 141 and the second terminal set 142 and output the converted power via the other of the first terminal set 141 and the second terminal set 142.

The power conversion circuit 140 of the power converter 14 uses an AC to AC power conversion circuit topology. The first terminal set 141 of the power conversion circuit 140 is electrically coupled to the first network 11 which in turn is electrically coupled to the first power source 10, and the second terminal set 142 of the power conversion circuit 140 is electrically coupled to the second network 13 which in turn is electrically coupled to the second power source 12. The power conversion circuit 140 can use a back-to-back converter system with two voltage source converters U1, U2 electrically connected by a DC link C. and both of the two voltage source converters U1, U2 can use power conversion circuits for converting between AC and DC power with their DC sides are electrically coupled by the DC link C. The skilled person should understand that as an alternative, a topology of direct AC to AC power converter, such as matrix converter, can be used for the power conversion circuit 140.

Figure 2:
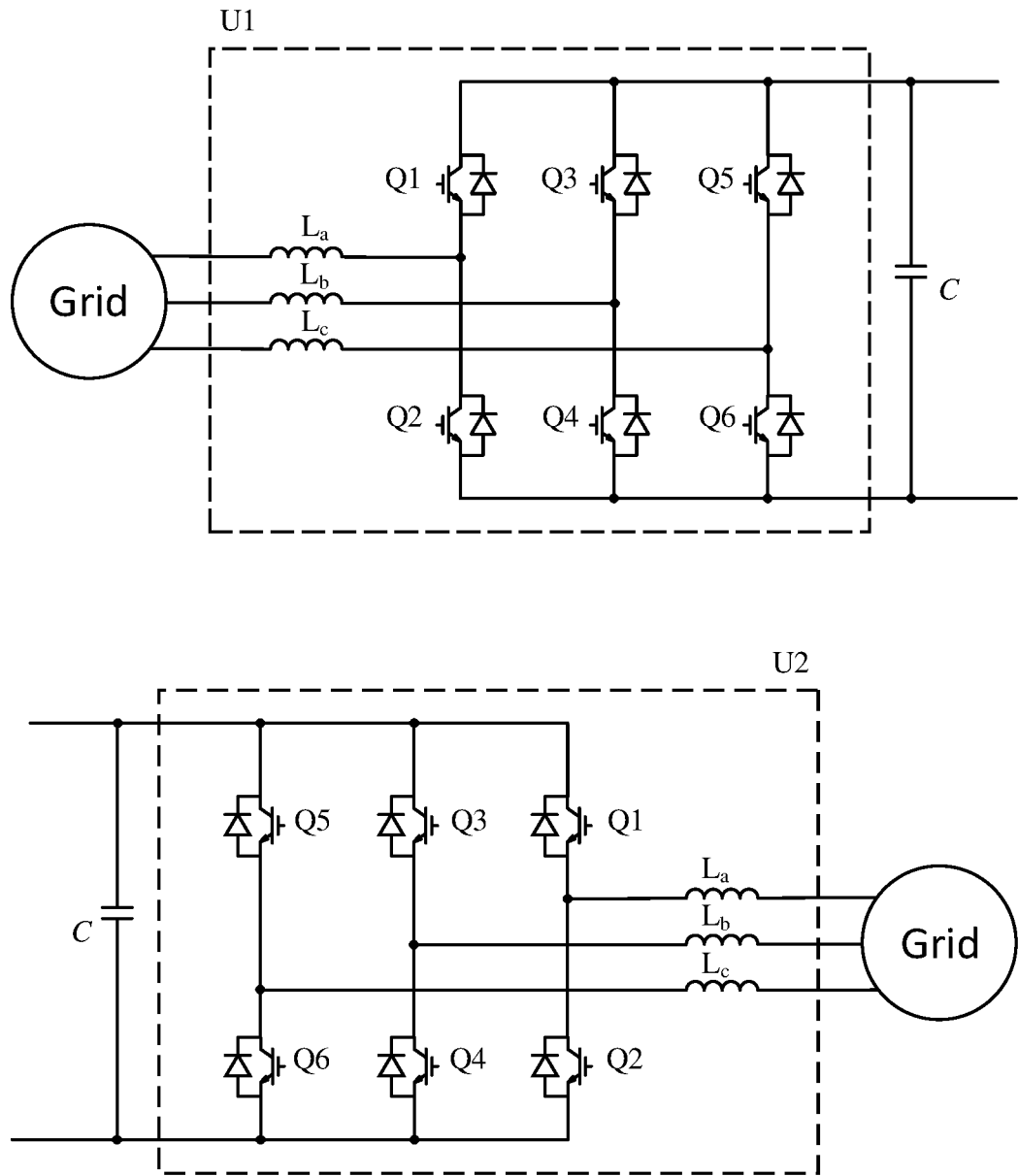
FIG. 2 illustrates the power converter according to an embodiment of present invention.

FIG. 2 illustrates the power converter according to an embodiment of present invention. As shown in FIG. 2, the voltage source converter U1 uses power semiconductor switches both turn-on and turn-off can be controlled, such as the insulated-gate bipolar transistor (IGBT). As a result, they can be used to make self-commutated converters. In such converters, the polarity of DC voltage is usually fixed and the DC voltage, being smoothed by a large capacitance of the DC link C, can be considered constant. The controllability gives many advantages, notably the ability to switch the IGBTs on and off many times per cycle in order to improve the harmonic performance. Being self-commutated, the converter no longer relies on synchronous machines in the AC system for its operation.

The voltage source converter U1 can use a six pulse bridge in which the power semiconductor switches use IGBTs with inverse-parallel diodes. With the help of the DC link C behaves like a DC smoothing capacitor, the voltage source converter can output two voltage levels at the AC output of each phase that correspond to the electrical potentials of the positive and negative DC terminals. Pulse-width modulation (PWM) can be used to improve the harmonic distortion of the converter. As an alternative, the voltage source converter U1 can be built with some form of multilevel converter, most commonly the Modular Multilevel Converter (MMC), in which each valve consists of a number of independent converter submodules, each containing its own storage capacitor. The IGBTs in each submodule either bypass the capacitor or connect it into the circuit, allowing the valve to synthesize a stepped voltage with very low levels of harmonic distortion.

Similarly, the other voltage source converter U2 can use a six pulse bridge in which the power semiconductor switches use IGBTs with inverse-parallel diodes. With the help of the DC link C behaves like a DC smoothing capacitor, the voltage source converter can output two voltage levels at the AC output of each phase that correspond to the electrical potentials of the positive and negative DC terminals. Pulse-width modulation (PWM) can be used to improve the harmonic distortion of the converter. As an alternative, the voltage source converter U1 can be built with some form of multilevel converter, most commonly the Modular Multilevel Converter (MMC), in which each valve consists of a number of independent converter submodules, each containing its own storage capacitor. The IGBTs in each submodule either bypass the capacitor or connect it into the circuit, allowing the valve to synthesize a stepped voltage with very low levels of harmonic distortion.

Referring back to FIG. 1, the power converter 14 further includes at least one measurement unit 143. Measurement unit 143 in accordance with the invention is arranged at a measuring point of the first network 11 adjacent to one end thereof. Possible fault locations, within and outside of the protection zone L1, L2, L3, L4, are separated by circuit breakers S1, S2, S3, S4 inserted in the first network 11. As shown in FIG. 1, the measuring unit 143 is arranged between one of the circuit breakers S1, S2, S3, S4 and the first terminal set 141 of the power conversion circuit 140. The measurement unit 143 can be a voltage sensor, a current sensor or a combination thereof. The measurement unit 143 can be used for measuring value of phase voltage at the measuring point of the first network 11; besides, the measurement unit 143 can be used for measuring value of phase current at the measuring point of the first network 11. The skilled person shall understand that as an alternative, the measurement unit 143 can be used for measuring line voltage and/or line current at the measuring point. With this configuration, a fault occurring on the first network 11 can be located.

If it is desirable to locate a fault occurring on the second network 13, the power converter 14 further includes another measurement unit 145. Measurement unit 145 in accordance with the invention is arranged at a measuring point of the first network 13 adjacent to one end thereof. Possible fault locations, within and outside of the protection zone L5, L6, L7, L8, are separated by circuit breakers S5, S6, S7, S8 inserted in the second network 13. As shown in FIG. 1, the measuring unit 145 is arranged between one of the circuit breakers S5, S6, S7, S8 and the second terminal set 142 of the power conversion circuit 140. The measurement unit 145 can be a voltage sensor, a current sensor or a combination thereof. The measurement unit 145 can be used for measuring value of phase voltage at the measuring point of the second network 13; besides, the measurement unit 145 can be used for measuring value of phase current at the measuring point of the second network 13. The skilled person shall understand that as an alternative, the measurement unit 145 can be used for measuring line voltage and/or line current at the measuring point.

Figure 3:
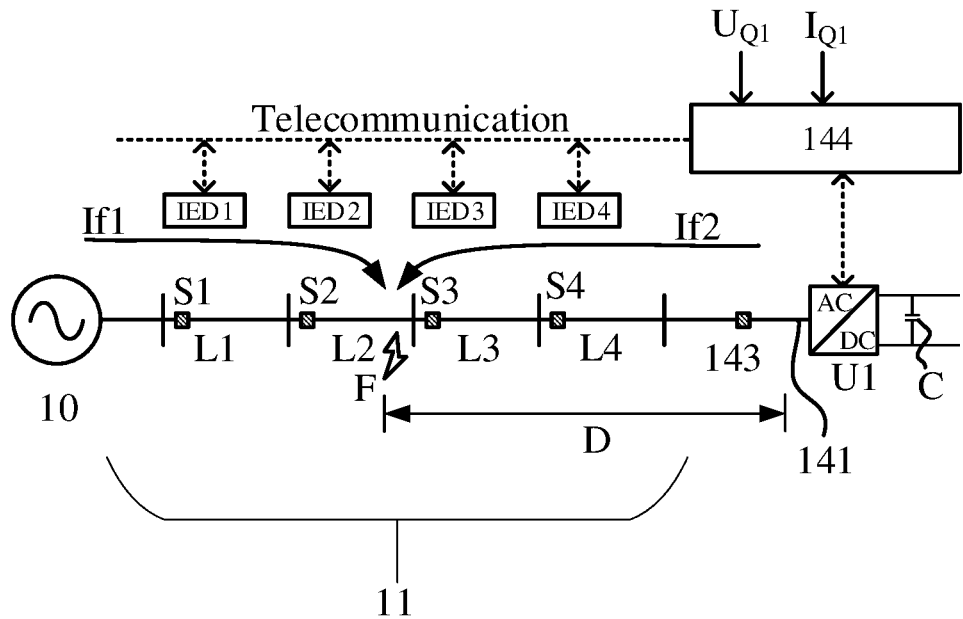
FIG. 3 illustrates fault location on the first network according to an embodiment of present invention.

FIG. 3 illustrates fault location on the first network according to an embodiment of present invention. As shown in FIG. 3, on occurrence of a fault at a point in the first network 11, within one of the protection zones L1, L2, L3, L4, a disturbance in the form of travelling waves moves outwardly along the first network 11 from the fault-occurring point and is detected by the measurement 143. For example, a phase to phase fault happens at point F within the protection zone L2, a voltage dip of corresponding phase lines will appear at the measurement unit 143 arranged at one end of the first network 11 to the first terminal set 141 of the power conversion circuit 140. A controller 144 of the power converter 14 will control its output current, which can be regarded as the short circuit current contributed by the converter but controlled to a maximum limitation. The fault event is detected based the voltage dip amplitude and the short circuit current from the converter or other methods such as methods based on communication. In particular, the circuit breakers S1, S2 will have fault current If1 flows from the first power source 10 to fault location F at within the protection zone L2. The circuit breaker S2 will trip immediately, while the circuit breaker S1 is as backup protection, according to the TSOCP algorithm. The circuit breakers S3, S4 will have fault current If2 from the power converter 14 to the fault location F. The output voltage and current at the measuring point (i.e. UQ1 and IQ1) at the side to the first terminal set 141 of the power converter 14 are measured by the measurement unit 143 and communicated to the controller 144 of the power converter 14. The phase to phase fault F is identified by the voltage and current measurements, UQ1, IQ1 since fault F will result in an obvious voltage dip and a short circuit current (limited to maximum current limitation of the voltage source converter U1). The fault event can be identified based on a condition if a change rate of the measurement of the voltage/current exceeds a threshold. If the fault component current can be detected, we will know that there is a short circuit fault occurring in the line. For example, define fault criteria as:

$$\begin{cases} |i_{A(k)} - i_{A(k-N)}| > i_{set} \\ |i_{B(k)} - i_{B(k-N)}| > i_{set} \\ |i_{C(k)} - i_{C(k-N)}| > i_{set} \end{cases} \quad (1)$$

Where, $i_{A(k)}$, $i_{B(k)}$ and $i_{C(k)}$ are the kth sampling point of Phase A, B and C respectively; $i_{A(k-N)}$, $i_{B(k-N)}$, and $i_{C(k-N)}$ are the (k-N)th sampling point of Phase A, B and C respectively; N is the number of sampled points per fundamental period, such as 20 ms for a 50 Hz grid system;

$i_{set}$ is the predefined threshold current value for protection.

If any of the three criteria is fulfilled, a short circuit fault can be identified. Similarly, the voltage changing rate can be also used for the phase to phase short circuit identification.

Figure 5:
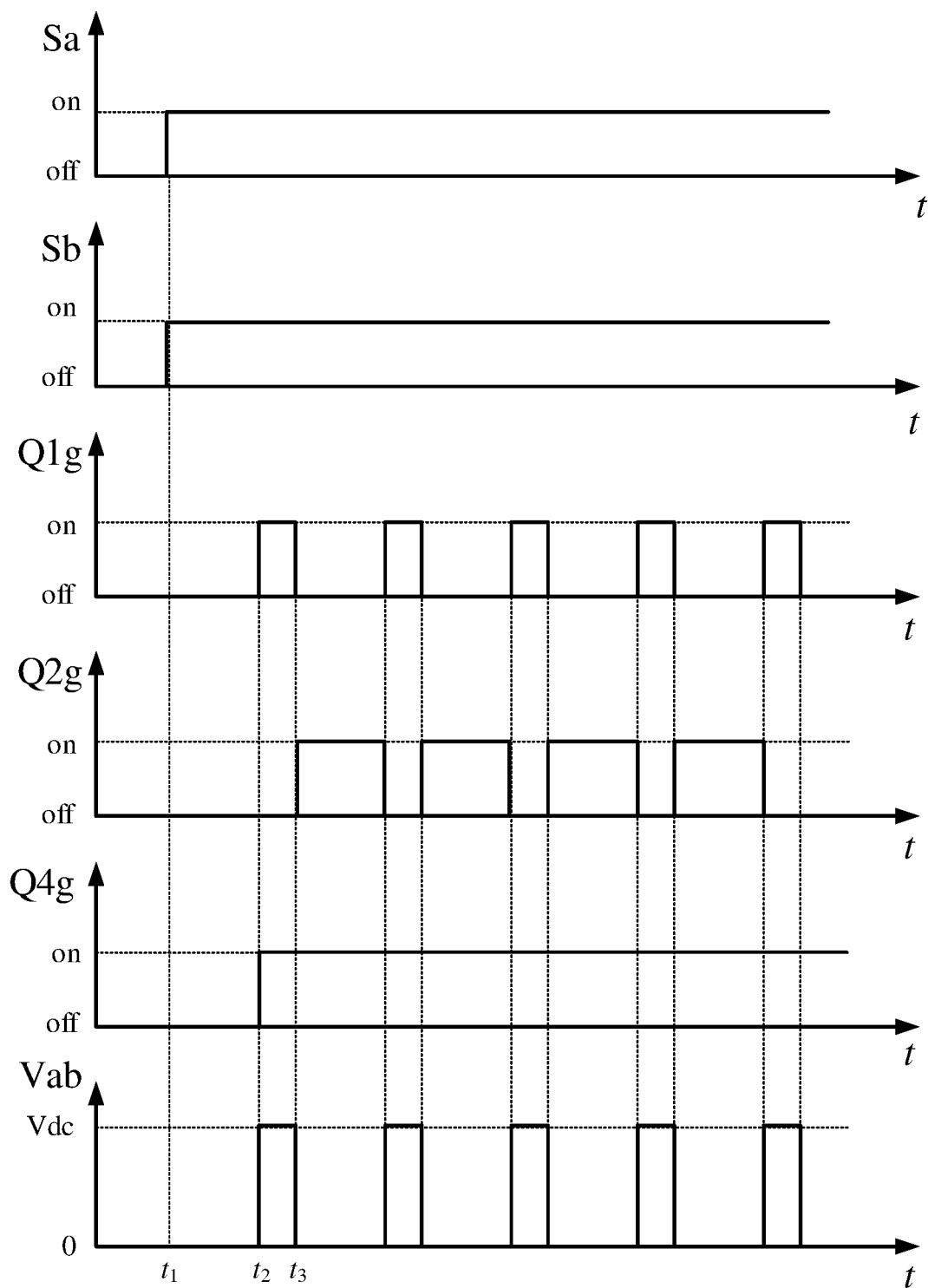
FIG. 5 illustrates the operation of the power converter according to an embodiment of present invention.

FIG. 5 illustrates the operation of the power converter according to an embodiment of present invention. When short circuit between phase A and phase B is identified, an operation sequence will be ordered as shown in figure below, in which Q1g, Q2g and Q4g are the gate driver signals of Q1, Q2 and Q4 respectively. Here it is assumed that the converter U1 is a three phase half bridge 2-level converter. Other converter type is also applicable by similar concept. At $t_0$, the close signal of $S_a$ and $S_b$ are ordered, phase reactor $L_a$ and $L_b$ are by passed. At $t_2$, Q4 is switched on, Q1 and Q2 are switched on and off complementarily with high frequency. Consequently, a high frequency voltage pulse $V_{ab}$ is exerted between phase A and Phase B by U1.

Figure 4:
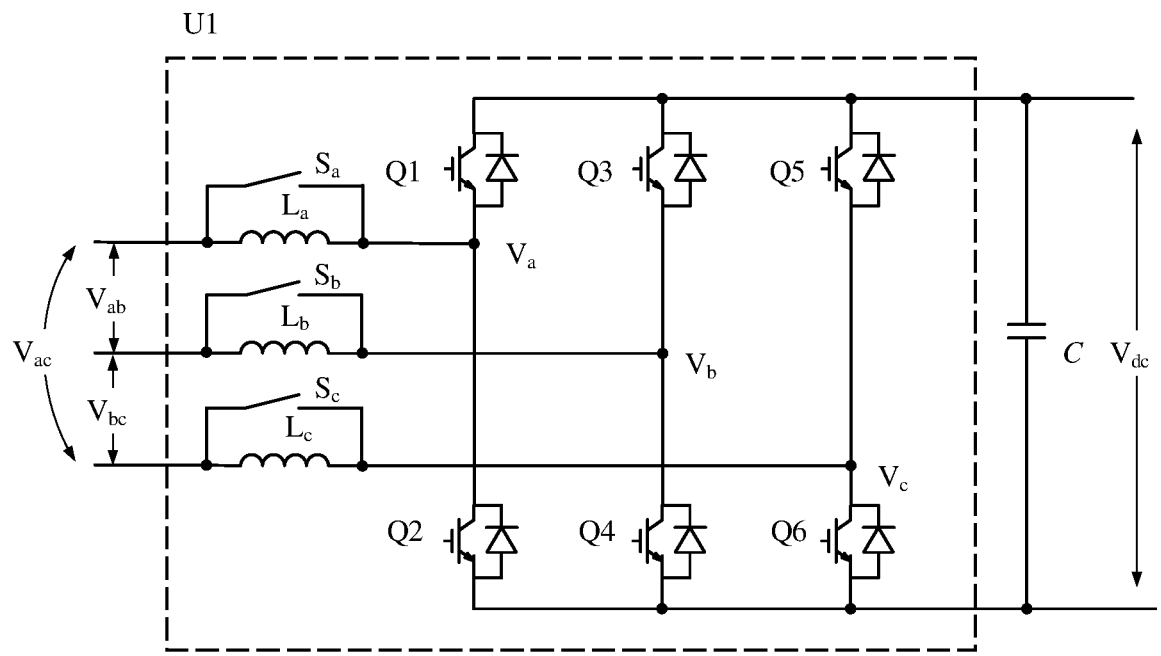
FIG. 4 illustrates the power converter circuits according to an embodiment of present invention.

Once a fault event is identified by the controller 144, the controller 144 controls the power conversion circuit 140 to generate a voltage/current waveform travelling along the first network 11. Under such scenario, the power converter 14 performs as of an AC to AC power converter which converting power supplied from the second power source 12 to the voltage/current waveform travelling along the first network 11. Once the fault event is identified, a detection waveform, for example which is a series of high frequency current pulses, will be generated by converter U1. In order to realize a steep current waveform edge, at least two of the phase reactors La, Lb or Lc is by passed by respective bypass switch Sa, Sb or Sc. The converter U1 with bypass switch is shown in FIG. 4.

Because the solution is dependent on the travelling waves, which are transient, it is necessary to isolate these by removing the steady state current and voltage components from the signals provided by the transducers within the measurement unit 143. This could be done in several ways, one satisfactory method, which has been used in the past, being continually to monitor the transducer outputs and to store the signals for a period corresponding to the duration of one whole cycle of the power-system (i.e. 0.02 or 0.01 s for a 50 Hz system). In the case, the stored quantities are subtracted from the signals during the next cycle to give zero output in each case, when the circuit conditions are unchanged. This process can be done by sampling the waves and storing them digitally. They can then be recovered in their original form for subtraction by using digital/analogue convertors.

The output of non-zero quantities at the end of this process indicates the presence of a disturbance. The controller 144 is configured to identify the voltage/current waveform from the measurements of the measurement unit 143 and record a first timing when it identifies the waveform.

As described above, under the control of the controller 144, the power converter 14 generates the detection waveform and initiates travelling waves of voltage and current on the first network 11, and they move outwardly along the first network 11 from the first terminal set 141 of the power converter 14 and are detected by the measurement 143, and which in turn travel to the other end of the first network 11. On arrival at the fault location F of the first network 11 the travelling waves are completely or partially reflected, depending on the circuits connected to the fault point F of the first network 11. The echo voltage waveform reflected from fault location F will be measured by the measurement unit 143 and identified by the controller 144 from the instant measurement. The controller 144 records a second timing when it identifies the echo of the waveform. The time at which these voltages were present may be found from the variations which have been occurred in the line end voltages and currents and thus the time taken for the waves to travel from the fault to the line end may be determined. Because the velocity of the travelling waves is known the fault position can be found.

A possible method of determining the position of a line fault is described below, a single phase circuit of length L being considered for simplicity. From the movement of the first voltage/current waveforms at the measuring measuring point, the voltage/current waveforms are injected into the first network 11 in response to a voltage dip detected by the measurement unit 143. Based on the time difference Δt between the first timing and the second timing, the distance D between the power converter 14 and fault location F is calculated. Based on the value of D, the fault location is determined. In this example, the fault is located at line section L2, between breakers S2, S3. Finally, the breaker trip signal is sent to the circuit breaker S3 via telecommunication in order to isolate the fault from the rest of lines at the power converter side.

To this basic scheme several refinements are added to avoid possible malfunctions imposed by the following conditions. The power converter 14 further includes a by-passing device, being configured to short circuit a filter inserted between the first network and the first terminal set of the power conversion circuit; wherein: the controller is further configured to issue a command to close the by-passing device substantially in parallel with the generation of the voltage/current waveform.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

What is claimed is:

1. A power converter, including:
    a power conversion circuit having a first terminal set and a second terminal set, being configured to convert power input via one of the first terminal set and the second terminal set and output the converted power via the other of the first terminal set and the second terminal set;
    a measurement unit, being configured to measure voltage/current at a point on a first network linking a first power source and the first terminal set of the power conversion circuit, wherein the point is arranged between a circuit breaker inserted in the first network and the first terminal set of the power conversion circuit;
    a controller, being configured to control the power conversion circuit to:
    generate a voltage/current waveform travelling along the first network with a power supplied by a second power source linked to the second terminal set of the power conversion circuit in response to a condition that a change rate of the measurement of the voltage/current exceeds a threshold;
    identify the voltage/current waveform from the measurements of the measurement unit; and
    locate a fault on the first network in consideration of an interval between a first timing when the controller identifies the voltage/current waveform and a second timing when the controller identifies an echo of the voltage/current waveform.

2. The power converter according to claim 1, further includes:
    a by-passing device, being configured to short circuit a filter inserted between the first network and the first terminal set of the power conversion circuit;
    wherein:
    the controller is further configured to issue a command to close the by-passing device substantially in parallel with the generation of the voltage/current waveform.

3. The power converter according to claim 1, wherein: the voltage/current waveform has a distinctive pattern.

4. The power converter according claim 3, wherein: the power conversion circuit is of a bi-directional power conversion circuit.

5. A distribution network using the power converter according to claim 4.

6. A distribution network using the power converter according to claim 3.

7. The power converter according to claim 2, wherein: the power conversion circuit is of a bi-directional power conversion circuit.

8. A distribution network using the power converter according to claim 7.

9. A distribution network using the power converter according to claim 2.

10. The power converter according to claim 1, wherein: the voltage/current waveform has a distinctive pattern.

11. The power converter according to claim 10, wherein: the power conversion circuit is of a bi-directional power conversion circuit.

12. A distribution network using the power converter according to claim 11.

13. A distribution network using the power converter according to claim 10.

14. The power converter according to claim 1, wherein: the power conversion circuit is of a bi-directional power conversion circuit.

15. A distribution network using the power converter according to claim 14.

16. A distribution network using the power converter according to claim 1.

17. A method for controlling a power converter, including:
    measuring voltage/current at a point on a first network linking a first power source and a first terminal set of the power converter;
    controlling the power converter to generate a voltage/current waveform travelling along the first network with a power supplied by a second power source linked to a second terminal set of the power converter in response to a condition that a change rate of the measurement of the voltage/current exceeds a threshold;
    reading the measurements of voltage/current at the point after the condition becomes true and identifying the voltage/current waveform from the measurements; and
    locating a fault on the first network in consideration of an interval between a first timing when the controller identifies the voltage/current waveform and a second timing when the controller identifies an echo of the voltage/current waveform.

18. The power converter control method according to claim 17, including:

issuing a command to close a by-passing device substantially in parallel with the generation of the voltage/current waveform;
wherein:
the by-passing device is configured to short circuit a filter inserted between the first network and the first terminal set of the power conversion circuit.

\* \* \* \* \*